(12) United States Patent
Korec et al.

(10) Patent No.: US 8,547,162 B2
(45) Date of Patent: Oct. 1, 2013

(54) INTEGRATION OF MOSFETS IN A SOURCE-DOWN CONFIGURATION

(75) Inventors: Jacek Korec, Sunrise, FL (US); Christopher B. Kocon, Mountain Top, PA (US); Shuming Xu, Schnecksville, PA (US)

(73) Assignee: Texas Instruments Incorporated, Dallas, TX (US)

( * ) Notice: Subject to any disclaimer, the term of this patent is extended or adjusted under 35 U.S.C. 154(b) by 331 days.

(21) Appl. No.: 12/964,527

(22) Filed: Dec. 9, 2010

(65) Prior Publication Data
US 2011/0148506 A1    Jun. 23, 2011

Related U.S. Application Data

(60) Provisional application No. 61/289,516, filed on Dec. 23, 2009.

(51) Int. Cl.
*H03K 17/687* (2006.01)

(52) U.S. Cl.
USPC ............ 327/434; 327/108; 327/437; 327/566

(58) Field of Classification Search
USPC .............. 327/108–112, 423–424, 434, 437, 327/564–566; 326/81–83, 86–87
See application file for complete search history.

(56) References Cited

U.S. PATENT DOCUMENTS

| | | |
|---|---|---|
| 4,001,860 A | 1/1977 | Cauge et al. |
| 4,455,565 A | 6/1984 | Goodman et al. |
| 5,155,563 A | 10/1992 | Davies et al. |
| 5,156,989 A | 10/1992 | Williams et al. |
| 5,252,848 A | 10/1993 | Adler et al. |
| 5,841,166 A | 11/1998 | D'Anna et al. |
| 5,907,173 A | 5/1999 | Kwon et al. |
| 5,912,490 A | 6/1999 | Hebert et al. |
| 5,949,104 A | 9/1999 | D'Anna et al. |
| 5,973,367 A | 10/1999 | Williams |
| 6,001,710 A | 12/1999 | Francois et al. |
| 6,215,152 B1 | 4/2001 | Hebert |
| 6,372,557 B1 | 4/2002 | Leong |
| 6,521,923 B1 | 2/2003 | D'Anna et al. |
| 6,600,182 B2 | 7/2003 | Rumennik |
| 6,653,740 B2 | 11/2003 | Kinzer et al. |

(Continued)

OTHER PUBLICATIONS

"Trenched Sinker LDMOSFET (TS-LDMOS) Structure for High Power Amplifier Application Above 2 GHz," IEEE No. 0-7803-7050-03/01, 2001, pp. IEDM 01-887-IEDM 01-890 (Cheon Soo Kim, et al.).

(Continued)

*Primary Examiner* — An Luu
(74) *Attorney, Agent, or Firm* — William B. Kempler; W. James Brady, III; Frederick J. Telecky, Jr.

(57) ABSTRACT

An output stage for a switched mode power supply has a high-side switch having a first power FET and a first speed-up FET monolithically integrated onto a first die. A low-side switch has a second power FET and a second speed-up FET monolithically integrated onto a second die. A semiconductor device has the power FET and the speed-up FET monolithically integrated in a "source-down" configuration. A method of operating an output stage of a switched mode power supply alternately turns on and off a high-side and a low-side switch and drives at least one of the switches with a speed-up FET monolithically integrated with the switch.

4 Claims, 8 Drawing Sheets

(56) References Cited

U.S. PATENT DOCUMENTS

| | | |
|---|---|---|
| 6,831,332 B2 | 12/2004 | D'Anna et al. |
| 6,870,222 B2 | 3/2005 | Kim et al. |
| 7,087,959 B2 | 8/2006 | Shibib et al. |
| 7,282,765 B2 | 10/2007 | Xu et al. |
| 7,420,247 B2 | 9/2008 | Xu et al. |
| 2002/0145184 A1 | 10/2002 | Perugupalli et al. |
| 2002/0185681 A1 | 12/2002 | Nakano et al. |
| 2005/0017298 A1 | 1/2005 | Xie et al. |
| 2005/0082610 A1 | 4/2005 | Shibib et al. |
| 2011/0043250 A1* | 2/2011 | Kuwana et al. ............ 326/89 |

OTHER PUBLICATIONS

"Low Gate Charge 30 V N-Channel LDMOS for DC-DC Converters," International Symposium on Power Semiconductor Devices & ICS, 15th: 2003, Cambridge, England, 4 pages (Norio Yasuhara, et al.).

"High Power Silicon RF LDMOSFET Technology for 2.1 GHz Power Amplifier Applications," IEEE Proceedings—Circuit Devices Syst. vol. 151, No. 3, Jun. 2004, 4 pages (S. Xu, et al.).

"High Performance RF Power LDMOSFET Technology for 2.1 GHz Power Amplifier Applications," Microwave Symposium Digest, 2003, IEEE MTT-S International Publication, Jun. 8-13, 2003, vol. 1, pp. 217-220 (Shuming Xu, et al.).

Office Action for U.S. Appl. No. 11/676,618, dated Aug. 5, 2010.

Office Action for U.S. Appl. No. 11/676,618, dated Jan. 6, 2010.

Office Action for U.S. Appl. No. 11/676,618, dated Jun. 25, 2009.

"Digitally Controlled DC-DC Converter," Proc. ISPSD 2006.

"Two Stage Voltage Regulator," Proc. APEC 2004, vol. 2.

U.S. Appl. No. 11/676,618, filed Feb. 20, 2007.

* cited by examiner

INTEGRATION OF MOSFETS IN A SOURCE-DOWN CONFIGURATION

CROSS-REFERENCE TO RELATED APPLICATIONS

This application is a nonprovisional of U.S. Provisional Application Ser. No. 61/289,516, filed Dec. 23, 2009 and is related to commonly-owned, co-pending application Ser. No. 12/964,484, entitled "MOSFET With Gate Pull-Down," which is a nonprovisional of U.S. Provisional Application Ser. No. 61/289,551, filed on even date, the contents of which are incorporated herein by reference in its entirety.

FIELD OF THE INVENTION

The present invention relates to an output stage for a switched mode power supply and, in particular, to an n-channel device which is particularly advantageous for such a stage.

BACKGROUND OF THE INVENTION

A switched mode power supply output stage is known from IR Design Tips, "High Current Buffer For Control IC's," DT-92-2A, which shows a CMOS buffer circuit which can be used as an output power stage of a control integrated circuit or a power stage in a gate driver circuit. The output stage consists of one p-channel and one n-channel transistor (Q3 and Q4) in a CMOS inverter connection. The turn-off of the output p-channel transistor (Q3) is assisted by another p-channel transistor (Q1) in a common source connection which speeds-up the discharging of the gate of the power switch (Q3). In a similar manner, a n-channel transistor (Q2) speeds-up the discharging of the gate of the output n-channel switch (Q4).

When the gate input signal is low, the speed-up transistor (Q1) is turned-on, securing a fast discharging of the gate of the p-channel MOS transistor switch (Q3) and a slower charging of the n-channel MOS transistor (Q4). The delay in turning-on the n-channel transistor switch (Q4) is determined by the RC constant formed by the resistor R1 and the input capacitance of the transistor (Q4). This delay is utilized to minimize the time period when both switches are on to minimize the cross-current flowing through the output inverter (Q3 and Q4).

In a similar way, when the input signal is going high, the speed-up transistor (Q2) secures a fast turn-off of the n-channel transistor switch (Q4) and a delayed turn-on of the p-channel transistor switch (Q3). This circuit enables the use of a CMOS inverter topology to provide several watts of output power, a power range where a cross-current associated with a simultaneous switching of the inverter transistors would lead to a prohibitively high power dissipation.

Utilization of speed-up transistors for allowing a hard turn-off of the power MOSFET and so minimizing the power losses related to switching events, would advantageously utilize monolithic integration of the speed-up transistors and the power switch transistors. Monolithic integration is the most effective way to minimize the parasitic inductance in the connections between the speed-up transistor and the main power switch, making the hard turn-off more effective. Vertical power MOSFET devices are usually designed with the drain electrode placed at the back-side of the die. Thus, the utilization of a technology for vertical MOSFETs, the back-side of the die acting as the source terminal would enable such monolithic integration. These devices would provide a minimum internal capacitance, and especially a minimum gate-to-drain capacitance (Cgd) which dictates the speed of the voltage transient across the transistor during switching events. The steeper the wave forms, the lower the power loss during switching.

SUMMARY OF THE INVENTION

It is a general object of the present invention to provide an improved output stage for a switched mode power supply and to provide an NMOS semiconductor device with the "source-down".

This and other objects and features are provided, in accordance with one aspect of the invention by an output stage for a switched mode power supply having a high-side switch comprising a first power FET and a first speed-up FET, wherein the first power FET and the first speed-up FET are monolithically integrated in a first single die. A low-side switch comprises a second power FET and a second speed-up FET, wherein the second power FET and the second speed-up FET are monolithically integrated in a second single die.

Another aspect of the invention includes a semiconductor device comprising a semiconductor substrate. A first n-channel laterally diffused metal oxide semiconductor (LDMOS) transistor is formed over the semiconductor substrate. At least one second n-channel LDMOS transistor is formed over the semiconductor substrate. First drain and gate electrodes are formed over the substrate electrically coupled to said first LDMOS transistor. Second drain and gate electrodes are formed over the substrate and electrically coupled to the second LDMOS transistor. A source of the first and second LDMOS transistors is electrically connected to the substrate via an electrical conductor, wherein current in channels of the LDMOS transistors flow downwardly into the substrate. A common source electrode is electrically coupled to the substrate.

A further aspect of the invention includes a method of operating an output stage of a switched mode power supply. A high-side MOSFET switch and a low-side MOSFET switch are alternately turned on and off. At least one of the high-side MOSFET switch or the low-side MOSFET switch is driven with a speed-up FET monolithically integrated with the high-side or low-side MOSFET switch.

DETAILED DESCRIPTION

Figure 1:
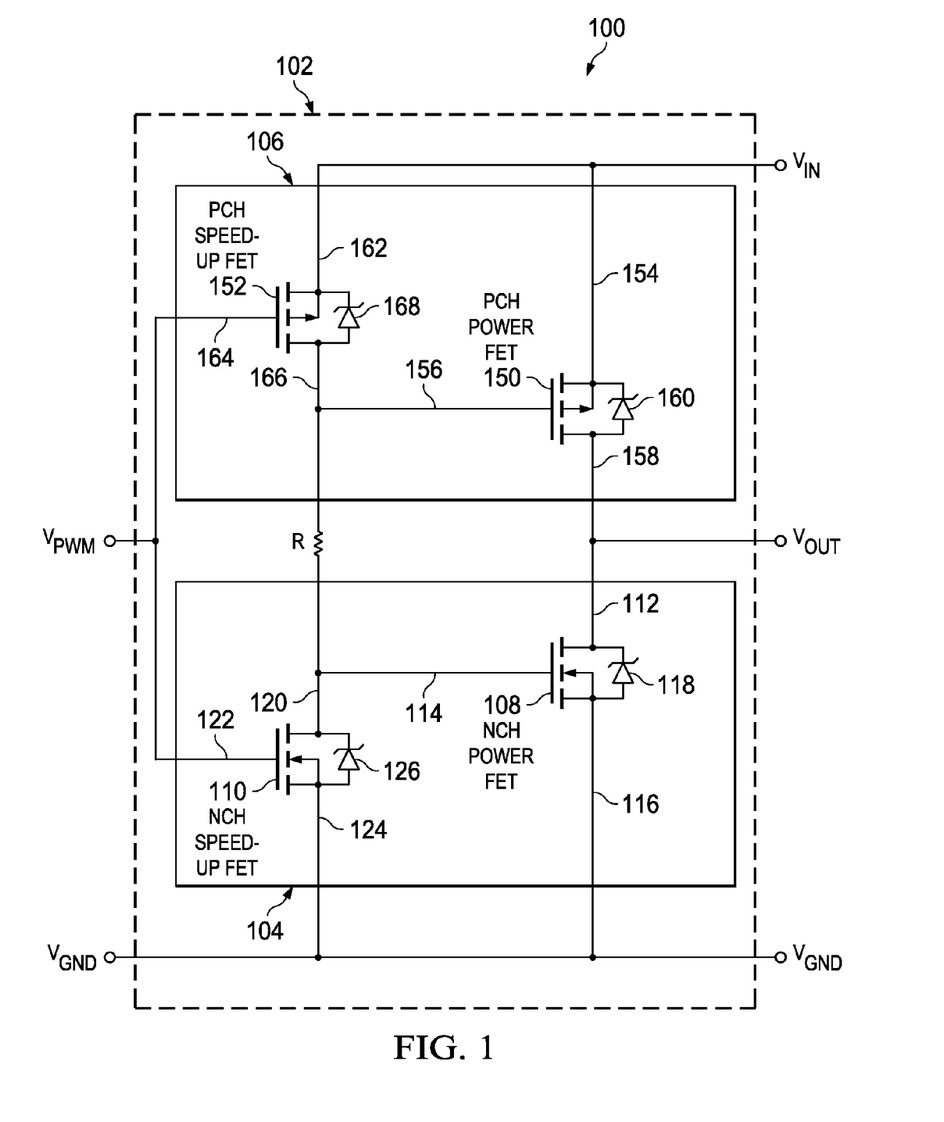
FIG. 1 is a schematic diagram of an output stage of a switched mode power supply according to the present invention.

FIG. 1 shows an output stage for a switched mode power supply, generally as 100. The output stage is formed as a module 102 which has two sub-modules, a first sub-module 104 for the low-side driver and a second sub-module 106 for the high-side driver. The low-side driver has a NMOS power switch 108 and a NMOS speed-up transistor 110. The drain 112 of NMOS power transistor 108 is connected to the output Vout and the source 116 is connected to ground Vgnd. The body diode 118 is connected as shown and the gate 114 is connected to the drain 120 of NMOS speed-up transistor 110. The source 124 of transistor 110 is also connected to Vgnd. The gate 122 of transistor 110 is connected to a source of pulse width modulation signals, as is well-known in the art, Vpwm. The transistors 108, 110 are connected in a common source configuration.

Sub-module 106 contains PMOS power switch 150 and PMOS speed-up transistor 152. The source 154 of PMOS transistor 150 is connected to the source of input voltage Vin. The drain 158 of PMOS power transistor 150 is connected to the terminal Vout. The body diode 160 is connected as shown and the gate 156 is connected to the drain 166 of PMOS speed-up transistor 152. The source 162 of PMOS speed-up transistor 152 is connected to the source of input voltage Vin. The body diode 168 is connected as shown and the gate 164 is connected to the source of pulse width modulation signals Vpwm, as well-known in the art, and connected to the gate 122 of NMOS speed-up transistor 110. A resistor R has one end connected to the drain 166 of PMOS speed-up transistor 152 and the gate 156 of PMOS power transistor 150. The other end of the resistor R is connected to the gate 114 of NMOS power switch 108 and the drain 120 of NMOS speed-up transistor 110.

Figure 2:
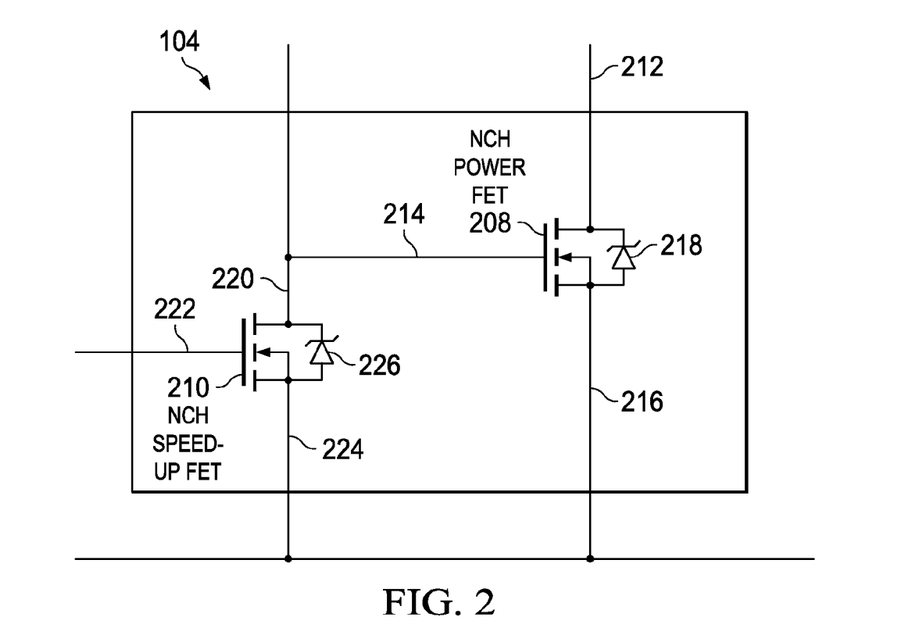
FIG. 2 is a schematic diagram of the current of a first sub-module of FIG. 1.

FIG. 2 shows the sub-module 104 separated from the circuit shown in FIG. 1. In FIG. 2, the NMOS power transistor 208 and the NMOS speed-up transistor 210, which correspond generally to the transistors 108 and 110 of FIG. 1, are integrated onto a single die. The transistors 208 and 210 are integrated on die 104 in order to minimize the inductance between the connection of the gate 214 of NMOS power switch 208 to the drain 220 of the NMOS speed-up transistor 210. The die comprises NMOS power transistor 208, having a body diode 218 connected as shown, a drain which is connected outside the die and a gate connected to the drain 220 of NMOS speed-up transistor 210. The body diode 226 of transistor 210 is connected as shown. The gate 222 and drain 220 of transistor 210 are connected outside the die. The source 224 of NMOS speed-up transistor 210 and the source 216 of NMOS power transistor 208 are connected in a common source configuration, with the common source being connected outside the die. These transistors are advantageously formed in a "source-down" configuration as shown and described in connection with FIG. 4 herein.

Figure 3:
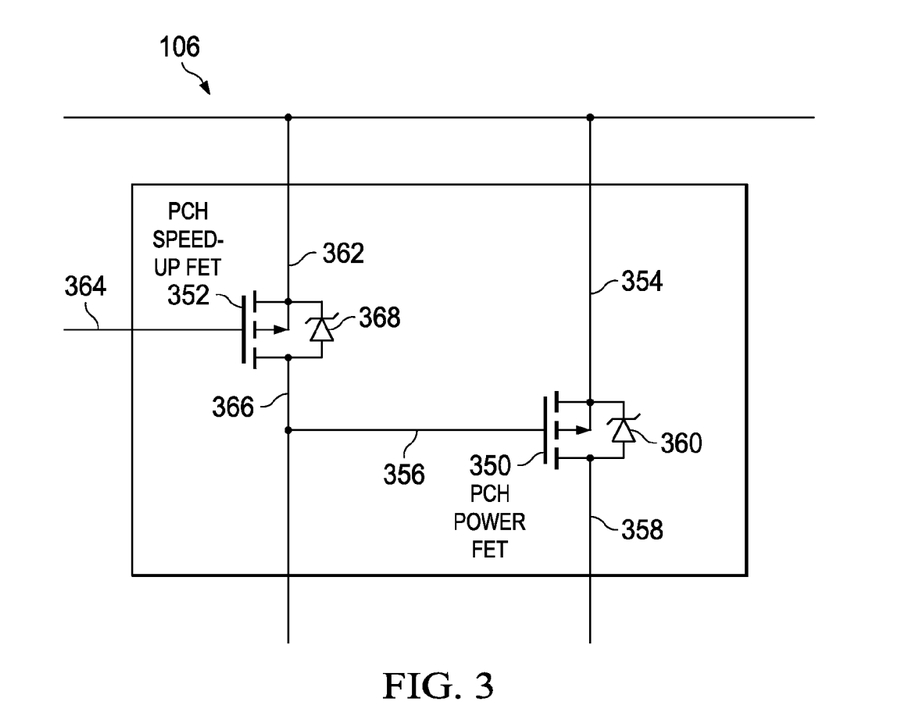
FIG. 3 is a schematic diagram of the current of a second sub-module of FIG. 1.

FIG. 3 shows the sub-module 106 separate from the circuit 100. In FIG. 3, the PMOS power transistor 350 and the PMOS speed-up transistor 364 correspond, respectively, to the PMOS main transistor 150 and the PMOS speed-up transistor 152 of FIG. 1, monolithically integrated onto a single die. PMOS power transistor 350 has its source 354 connected to the source 362 of PMOS speed-up transistor 352 and connected outside the die. The body diode 360 of transistor 350 is connected as shown and the gate 356 is connected to the drain 366 of PMOS speed-up transistor 352. The drains 358 and 366 of transistors 350 and 352, respectively, are connected off of the die as is the gate 364 of speed-up transistor 352. These transistors are also connected in a common source configuration. Advantageously, the transistors are integrated on a common die in the "source-down" configuration. These transistors can advantageously be produced in accordance with the teachings of co-pending application Ser. No. 11/676,618, entitled "MOS Transistor Device and Common Source Configuration," filed Nov. 20, 2007, which is incorporated herein by reference in its entirety. This configuration is shown and described herein with connection FIG. 5.

Figure 4:
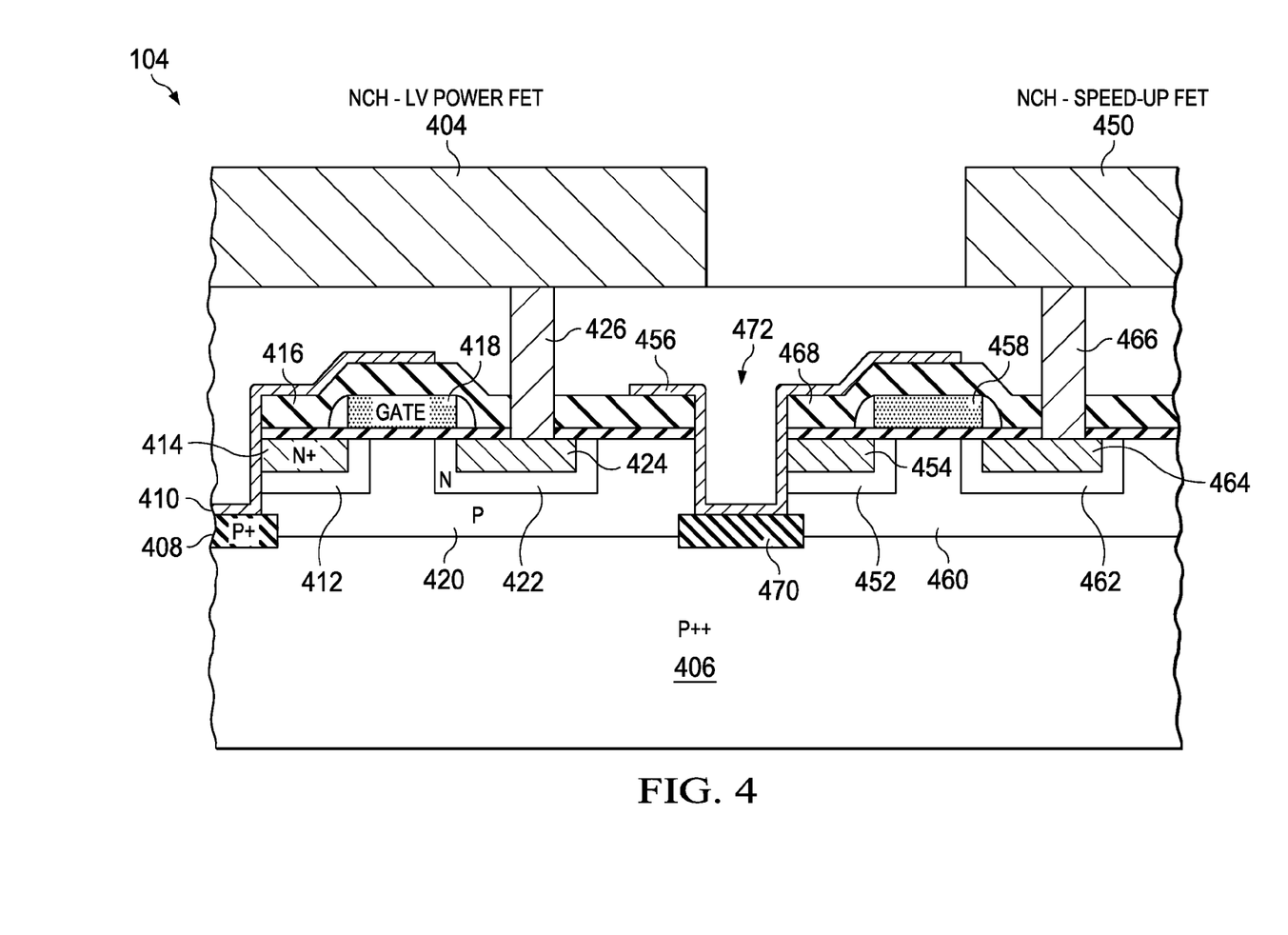
FIG. 4 is a cross-sectional view of a semiconductor implementation of the circuit of FIG. 2.

FIG. 4 shows a cross-section of a semiconductor implementation of the die 104 shown in FIG. 2. The NMOS devices built in accordance with the teachings of the present invention, are shown for voltages below 12 volts, and therefore, do not need distinguished lightly built extensions of the drain region (LDD). However, those skilled in the art recognize that such changes can be incorporated into the structure shown herein without departing from the present invention, in those cases where higher voltages are needed.

FIG. 4 shows the NMOS power FET 404 and the NMOS speed-up FET 450 integrated onto the same die. The P++ substrate 406 contains a P+ source contact 408. The substrate 406 will provide the source electrode for both the NMOS power switch 404 and the NMOS speed-up FET 450. Contact 408 is connected via an electrically conducted material 410 having metallic properties such as silicide. The silicide connects to N drain extension 412 and to N+ source 414. The drain extension 412 is shown as symmetrical as this reduces the cost of manufacturing, but is not required to practice the present invention. This material also provides a shielded gate structure, as shown in FIG. 4, by providing a conductive film interposed between the gate and drain terminals. The gate 418 is formed underneath insulator 416. The P region 420 forms the channel to the N drain extension 422 and the N+ drain 424. The drain is connected to the drain electrode via metallization 426.

NMOS speed-up FET 450 has an N source extension region 452 and source 454 connected by means of a film having metal properties such as Ti, Al, W or silicide such as $TiSi_2$ or $WSi_2$, connecting it via P+ source contact 470 to the P++ substrate 406, forming the source contact. The film 456 lines a trench 472, formed between the NMOS power transistor 404 and the NMOS speed-up transistor 450. Thus, the source region is electrically shorted to the body and substrate by the contact 470 and trench 472. A gate 458 is formed underneath insulator 468 and a P region 460 forms the channel underneath the gate. An N drain extension 462 is formed on region 460, a N+ drain 464 is formed thereon. The drain is connected via metallization 466 to the drain contact for the die. It should be understood that the symmetry shown for NMOS speed-up transistor 450 with regard to the source extension regions and drain extension regions are not required to practice the present invention, but reduces manufacturing costs by making the doping asymmetrical. It should also be noted that the NMOS speed-up transistor has a much smaller active area than the active area of the NMOS power transistor, as will be shown more clearly in connection with FIG. 6 herein.

Figure 5:
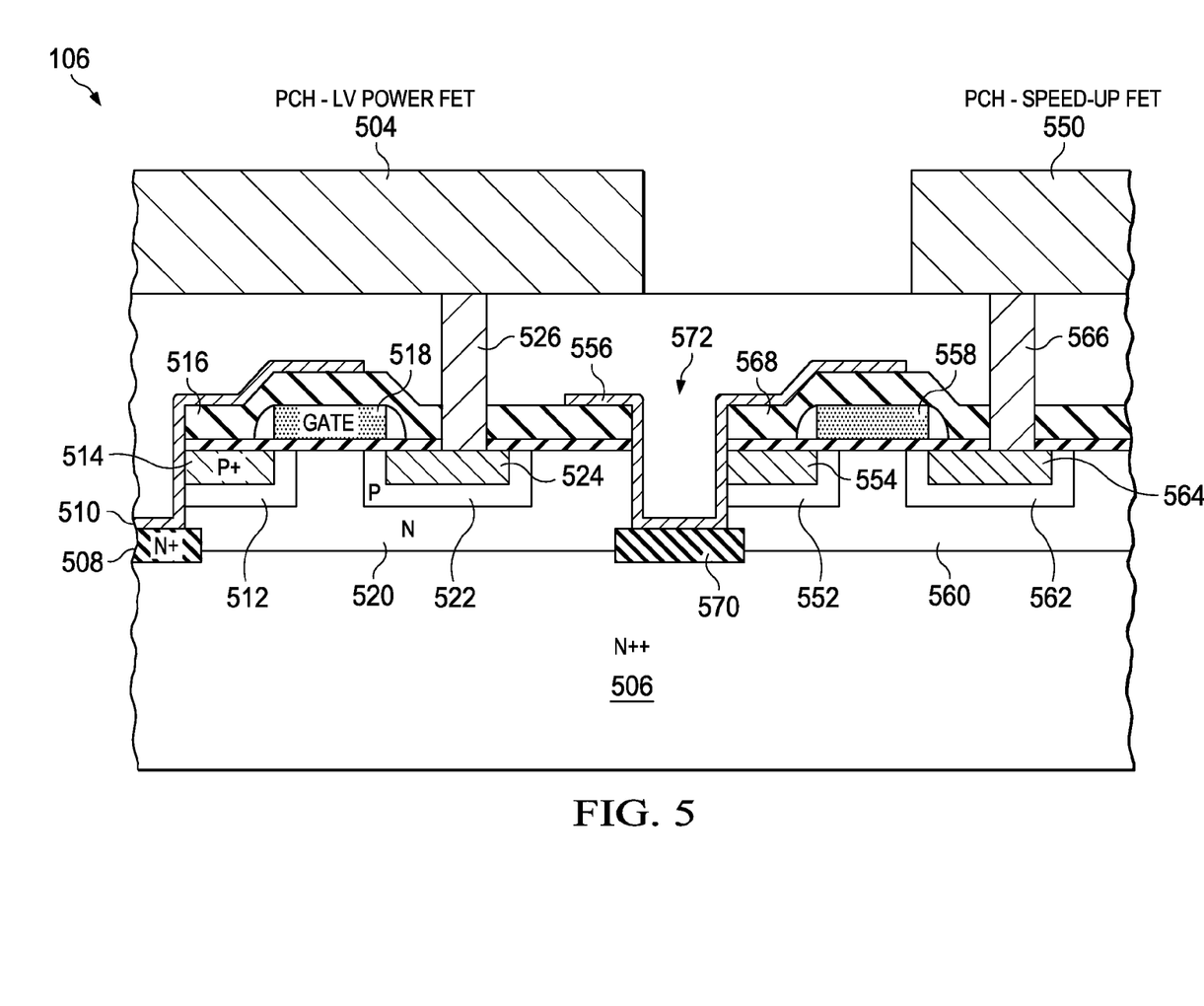
FIG. 5 is a cross-sectional view of a semiconductor implementation of the circuit of FIG. 3.

FIG. 5 shows a cross-sectional view of a semiconductor implementation of the die 106 shown in FIG. 3. The sub-module 106 comprises a PMOS R transistor 504 and a PMOS speed-up transistor 550 integrated to the same die. The transistors are formed on a N++ substrate 506, having a N+ source contact 508 connected via an electrically conductive material 510 having metallic properties, such as silicide, to the P source extension region 512 and the P+ source 514. A gate 518 is formed underneath insulator 516 over N body region 520 forming the channel underneath the gate. The film 510, which provides the connection between the source and body regions, is also used to form a shielded gate structure as a conductive film interposed between the gate and drain terminals. P drain extension region 522 is formed on the N body region 520 and has a P+ drain region formed thereon. The drain is connected to the exterior of the die via metallization 526.

The PMOS speed-up transistor 550 has a P source extension region 552 formed on a N body region 560, and having a P+ source formed thereon. The source extension region 552 and source 554 are connected by a film 556 having metallic properties such as Ti, Al, W or silicide such as $TiSi_2$ or $WSi_2$. The conductive film 556 lines trench 572, separating transistors 504 and 550. The film contacts N+ body contact region 570, which makes the connection for the common source configuration. A gate 558 is formed underneath insulator 568 and a drain extension 562 and drain region 564 are formed on the body region 560. A metallization 566 connects the drain 564 to the exterior of the die.

It should be noted that the shielded gate structure shown, in FIGS. 4 and 5, provides a Faraday shield between the gated drain terminals effectively reducing the Cgd capacitance. This feature is important in securing good switching performance of the power switch, as explained in more detail in U.S. Pat. No. 7,420,247, which is incorporated herein by reference in its entirety, but is not required to practice the present invention.

The fact that the substrate provides a common source electrode is a basic feature enabling monolithic integration of the vertical power MOSFETs in a common source configuration. In addition, in the structure shown in FIGS. 4 and 5, the substrate provides a source structure for both the speed-up and power transistors and the gate and drain electrodes of the speed-up transistor are connected to the application circuit. The drain electrode of the speed-up transistor is connected to the gate of the power transistor and the power transistor acts as a power switch to the current flowing between its drain and source terminals.

Figure 6:
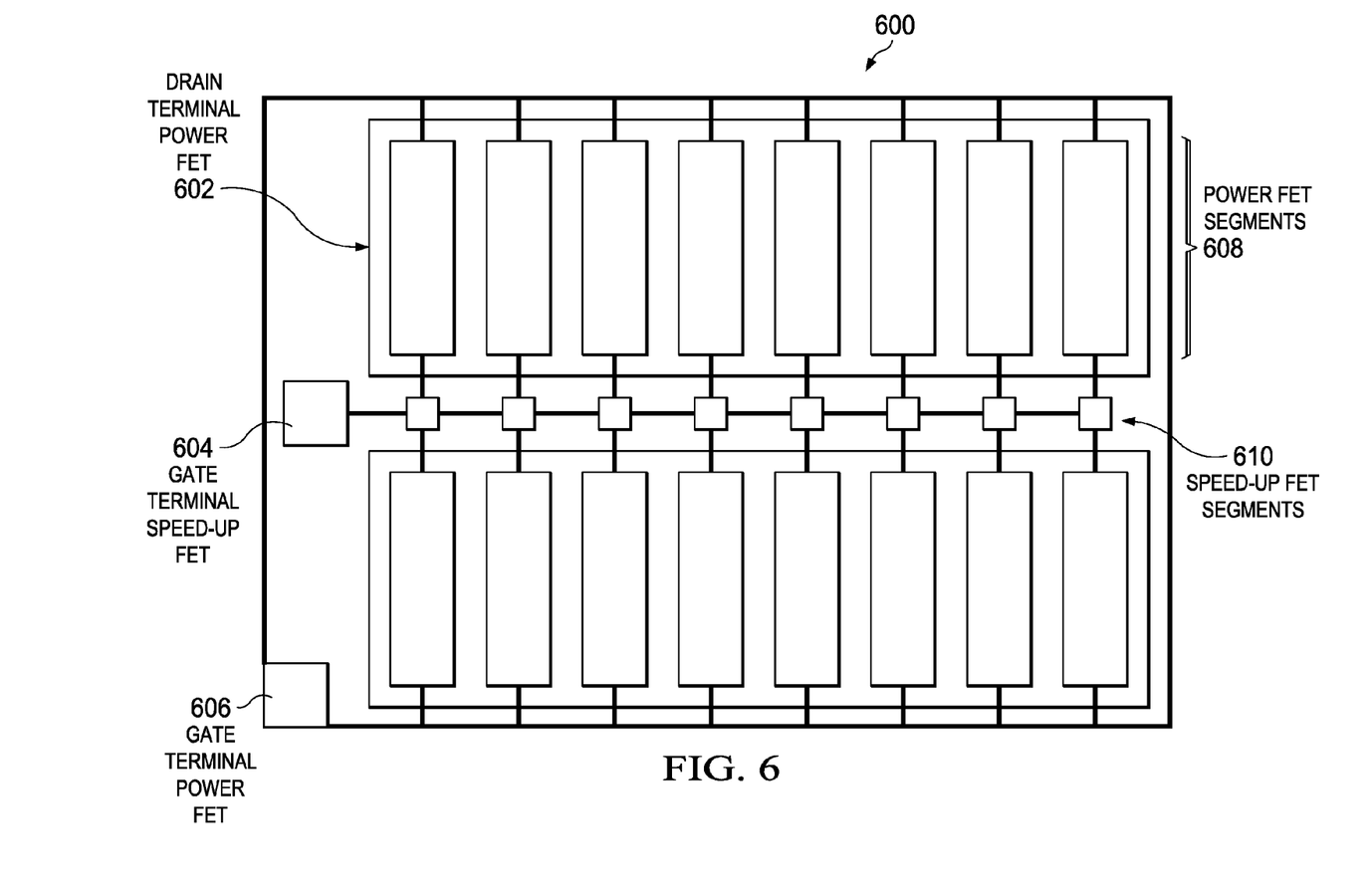
FIG. 6 is a top-view of the layout of the power and speed-up NMOS transistors of FIG. 2.

One feature that may be used to make the speed-up transistor more effective is to use the layout shown in FIG. 6, generally as 600. This figure corresponds to FIG. 2 of the co-pending application Ser. No. 12/964,484 referred to above, except that the resistor 206 is not shown as it is not utilized here. FIG. 6 shows the drain terminal of the power transistor 602, the gate terminals of the speed-up transistor 604, the gate terminal for the power transistor 606, the power transistor segments 608 and the speed-up transistor segments 610. It should be noted that the speed-up transistor segments 610 have the uniform distribution over the die with the segment structure of the power transistor, as illustrated in FIG. 6, which has an important advantage in providing a simultaneous, uniform hard drive to all segments of the power transistor during turn-off. It should also be noted that the speed-up transistor has a much smaller active area than the power switch transistor.

Figure 7:
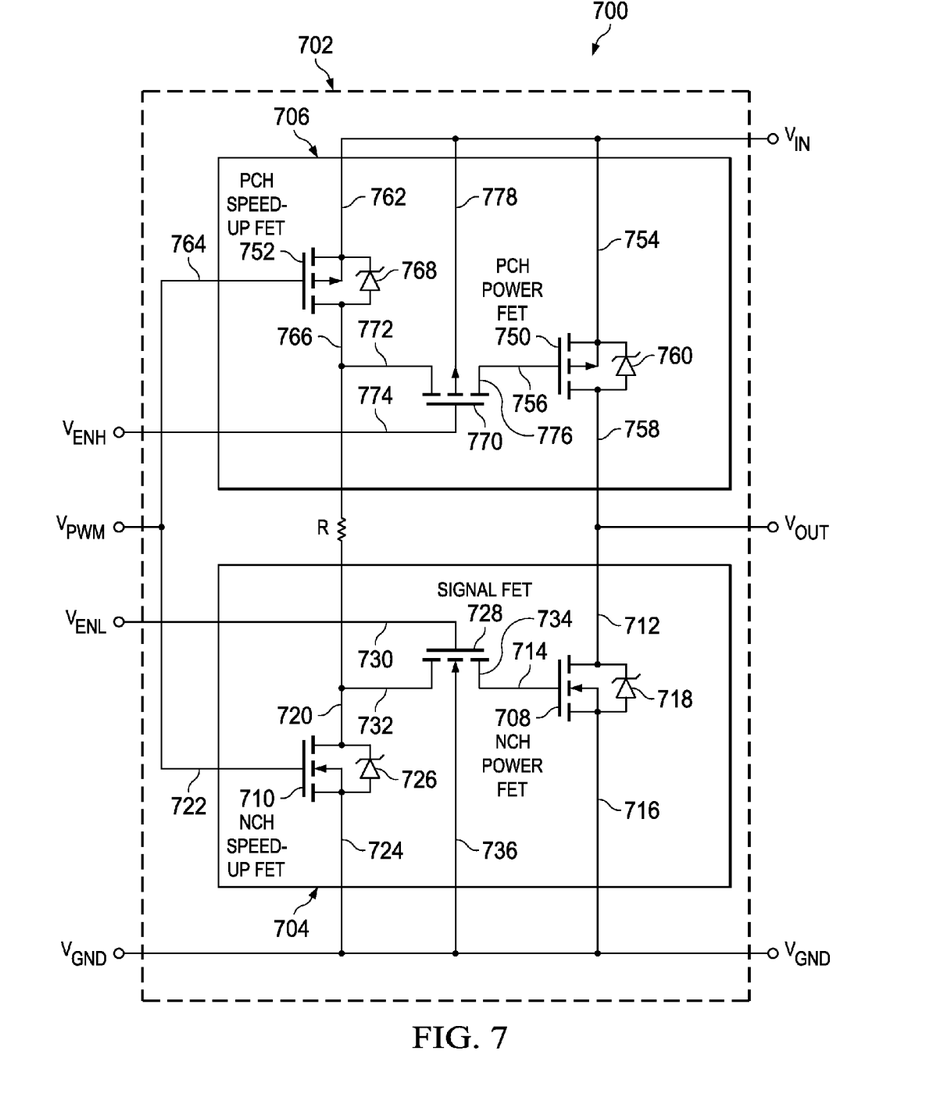
FIG. 7 is a schematic diagram of another embodiment of the present invention.

FIG. 7 shows another embodiment of the present invention, generally as 700. In this embodiment, a signal FET is inserted between the connection of the drain of the speed-up transistor and the gate of the power transistor. The purpose of the signal FET is to enable a stage of a switched mode power supply to be turned-off, in systems where multiple stages are utilized. It should be noted, that although a signal FET is shown in both the high-side and low-side switches, in some circuit designs, a signal FET will only be required at either the high-side or the low-side switch.

In FIG. 7, a power module 702 has sub-modules 704 and 706. Sub-module 704 is the low-side switch having a NMOS power transistor 708 and NMOS speed-up transistor 710. Drain 712 of NMOS power transistor 708 is connected to the output Vout. The body diode 718 is connected as shown and the gate 714 is connected to the source of NMOS signal FET 728. The drain 732 of NMOS signal FET 728 is connected to the drain 720 of NMOS speed-up transistor 710. The body diode 726 of transistor 710 is connected as shown. The drain 724 of NMOS speed-up transistor 710 and the drain 716 of NMOS power transistor 708 are connected together and connected to ground Vgnd. The drain 720 of NMOS speed-up transistor 710 is connected to one end of the resistor R. The gate 722 of NMOS speed-up transistor 710 is connected to a source of pulse width modulation signals Vpwm, as is well-known in the art. The gate 730 of signal NMOS FET 728 is connected to an enable signal Venl which turns NMOS signal FET 728 on or off to enable or disable the circuit of sub-module 704. It should be noted that the body of NMOS signal transistor 728 is connected to ground instead of the usual connection to its source.

High-side switch sub-module 706 has PMOS power transistor 750 and PMOS speed-up transistor 752. The source 754 of PMOS power transistor 750 is connected to the input voltage Vin. The drain 758 of PMOS power transistor 750 is connected to the output Vout. The body diode 760 is connected as shown and the gate 756 is connected to the source 776 of PMOS signal FET 770. The drain 772 of PMOS signal transistor 770 is connected to the drain 766 of PMOS speed-up transistor 752. The body of PMOS signal transistor 770 is connected to Vin at 778. The body diode 768 of PMOS speed-up transistor 752 is connected as shown and the gate 764 is connected to a source of pulse width modulation signals Vpwm and the gate 722 of speed-up transistor 710. The source 762 of PMOS speed-up transistor 752 is connected to Vin. The gate 774 of PMOS signal transistor 770 is connected to an enable signal Venl which will turn the transistor 770 off or on in order to enable or disable the sub-module 706. The drain 766 of PMOS speed-up transistor 752 and the drain 772 of PMOS signal transistor 770 are connected to the other end of the resistor R.

Figure 8:
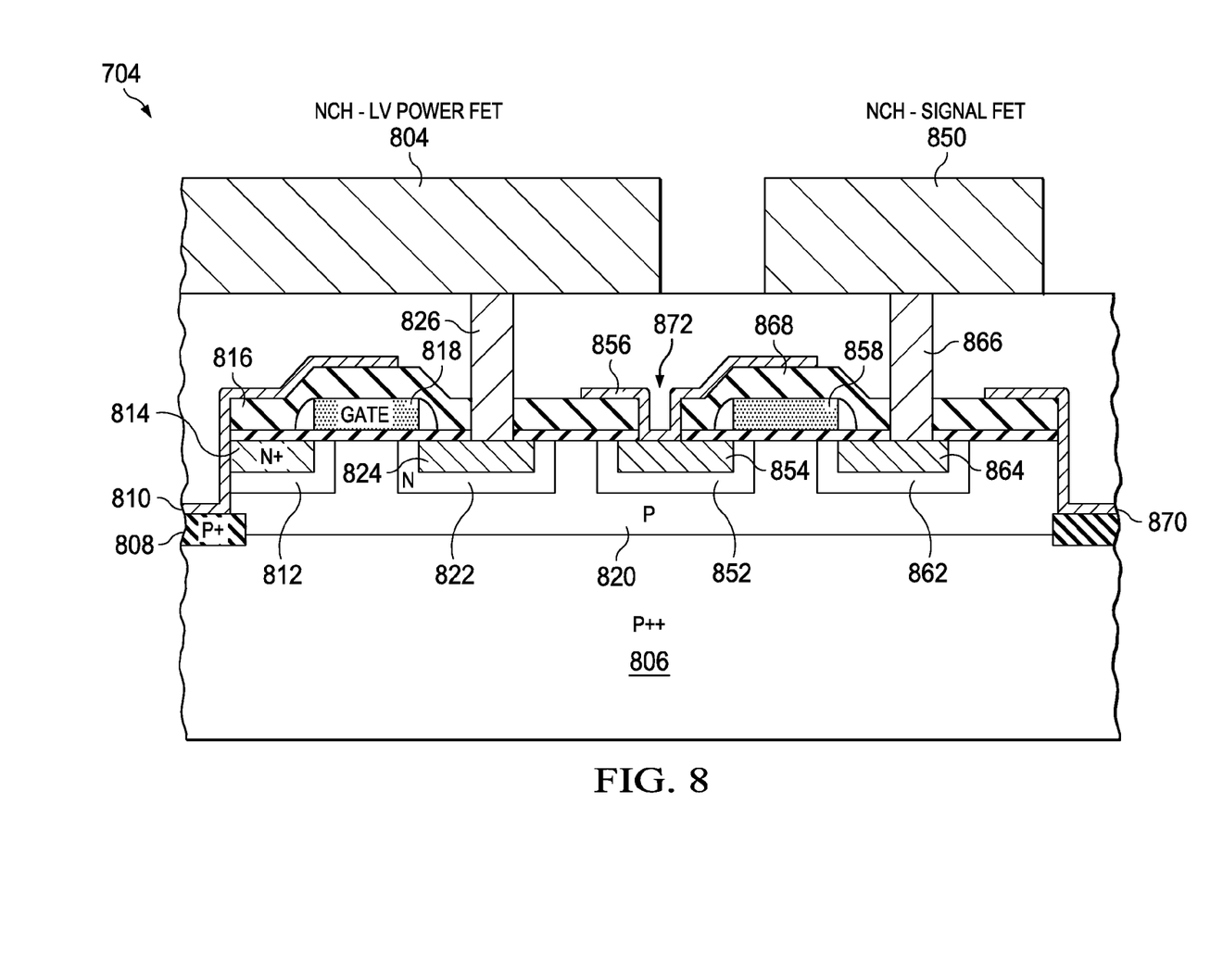
FIG. 8 is a cross-sectional view of a semiconductor implementation of a portion of the circuit of a first sub-module of FIG. 7.

FIG. 8 shows a cross-sectional view of a semiconductor implementation of sub-module 704 as shown in FIG. 7, in which the NMOS power transistor and NMOS signal transistor are integrated onto the same die. The integrated device is formed on a P++ substrate 806 having a P+ source contact 808. A film 810 having metallic properties such as silicide is used to make contact between source contact 808, a N source extension region 812 and a N+ source 814. A gate 818 is formed underneath insulator 816 and a P body region 820 is formed underneath gate 818. A N drain extension region 822 is formed over the body region 820 and a drain 824 is formed over the drain extension region 822. A metallization 826 is utilized to connect the drain to the exterior of the die.

A trench 872 is formed between the NMOS power transistor 804 and the NMOS signal transistor 850. A film having metallic properties like Ti, Al, W, or a silicide like $TiSi_2$ or $WSi_2$ lines the trench 872 to make contact to the source 854 and source extension region 852. A gate 858 is formed over insulator 868 and a drain extension region 862 and drain 864 are formed over the body 820. A metallization 866 is used to connect the drain outside the die.

It should be noted that the source for NMOS signal FET 850 can be accessed in a third dimension to the output of the die. It should also be noted that the symmetry shown in FIG. 8 is not necessary to practice the present invention, but is used to reduce manufacturing costs. Furthermore, the film at 870 could be utilized to make a connection to the NMOS speed-up FET, such as the NMOS speed-up 450 shown in FIG. 4, so that all three transistors could be integrated onto the same die.

Figure 9:
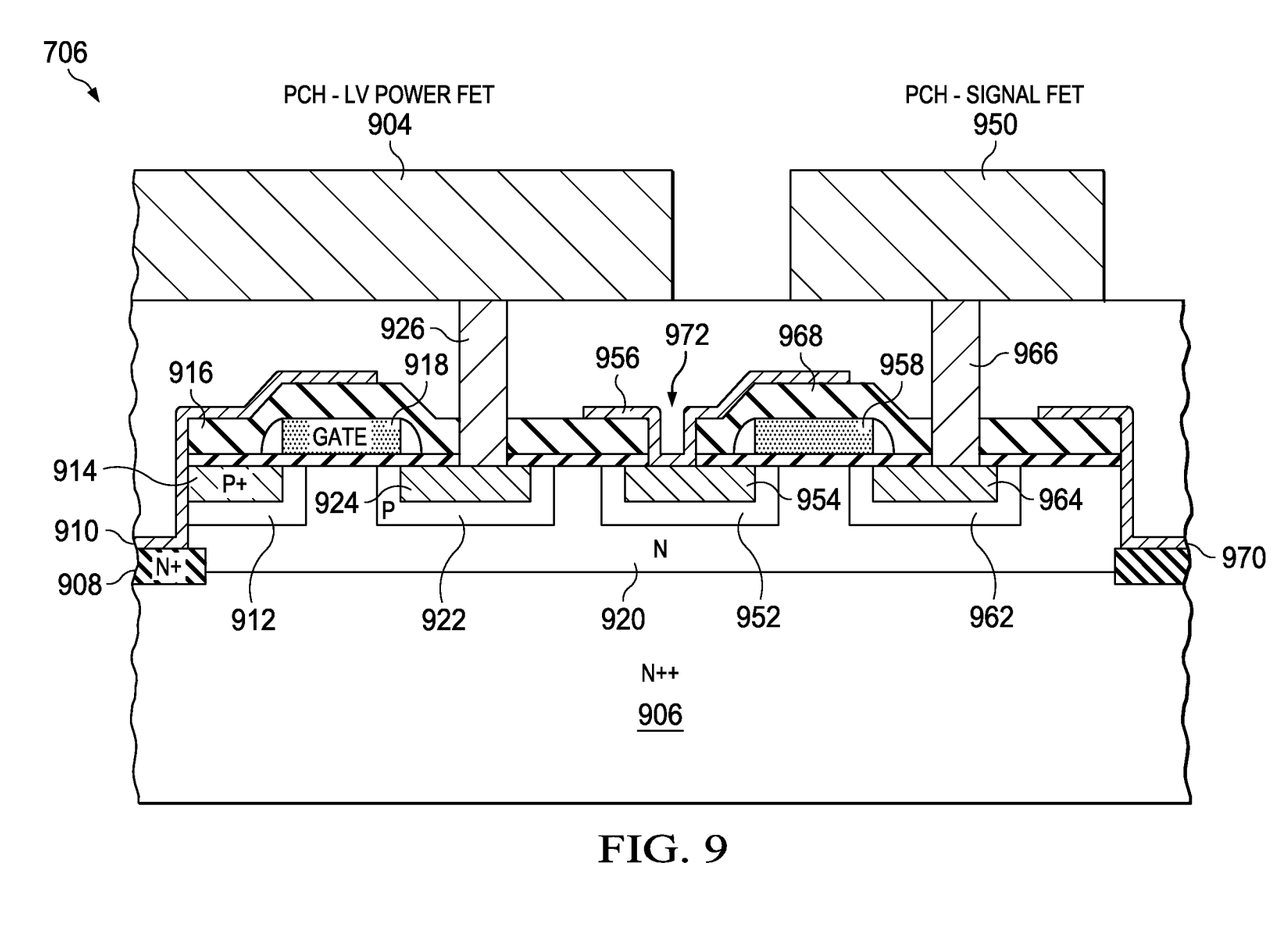
FIG. 9 is a cross-sectional view of a semiconductor implementation of a portion of the circuit of a second sub-module of FIG. 7.

FIG. 9 shows a cross-section of a semiconductor implementation of sub-module 706 of FIG. 7 having a PMOS power FET 904 and a PMOS signal FET 950 integrated on the same die. The integrated structures is formed on a N++ substrate 906 having a N+ source contact 908 connected via a film 910 having metallic properties such as silicide to a P source extension region 912 and a P+ source 914. A gate 918 is formed under insulator 916. A N body 920 is formed under the gate and has a P drain extension region 922 and a P+ drain 924 formed thereon. A metallization 926 connects the drain to the exterior of the die.

A trench 972 separates the PMOS power transistor 904 and the PMOS signal transistor 950. The trench is lined with a film having metallic properties like Ti, Al, W, or silicide like $TiSi_2$ or $WSi_2$. The film makes a contact to a P+ source 954 and a P source extension region 952. A gate 958 is formed under insulator 968 and a drain extension region 962 and drain 964 are formed on the N body 920. A Metallization 966 connects the drain to the exterior of the chip.

As with the n-channel version of this circuit, described above in connection with FIG. 8, the film 970 can be utilized to connect to the PMOS speed-up transistor as shown in FIG. 5 so that all three transistors could be integrated onto the same die. In addition, in the third dimension, the source of the PMOS signal FET can be accessed at the output. It should be noted that the film provides for a shielded gate structure interposing a conductive film between the gate and drain terminals. Also, a reverse bias can be applied to the source and drain electrodes of the signal transistor, enabling a flow-down operation of the signal transistor with respect to the source potential of the power transistor. It should also be noted that separate trench contacts are provided to pin the potential of the body region to the potential of the source region of the power transistor at selected locations of the circuit.

Although the present invention has been described in detail, it should be understood that various changes, substitutions and alterations can be made thereto without departing from the spirit and scope of the invention as defined by the appended claims. For example, the present invention can be advantageously manufactured in accordance with the teachings of U.S. Pat. No. 7,282,765 to reduce the gate drive requirement, which is incorporated herein in its entirety by reference.

The invention claimed is:

1. A semiconductor device comprising:
a semiconductor substrate;
a first n-channel laterally diffused metal oxide semiconductor (LDMOS) transistor formed over the semiconductor substrate;
at least one second n-channel LDMOS transistor formed over the semiconductor substrate;
first drain and gate electrodes formed over the substrate and electrically coupled to said first LDMOS transistor;
second drain and gate electrodes formed over the substrate and electrically coupled to the second LDMOS transistor;
a source of said first and second LDMOS transistors being electrically connected to the substrate via an electrical conductor, wherein current in channels of the LDMOS transistors flow downwardly into the substrate; and
a common source electrode electrically coupled to the substrate, wherein each of the LDMOS transistors include a plurality of LDMOS transistor cells coupled in parallel.

2. The semiconductor device of claim 1, further comprising a trench formed adjacent the source region of each transistor cell extending through the epitaxial layer to the substrate, wherein a conductive material is deposited in the trenches to couple the source regions to said substrate.

3. The semiconductor device of claim 1 further comprising a third n-channel MOSFET transistor formed over said semiconductor substrate, a source of the third transistor being coupled to a gate of the first n-channel transistor, a drain of the third transistor being coupled to the drain of the second n-channel transistor.

4. A method of operating an output stage of a switched mode power supply comprising:
alternately turning on and off a high-side MOSFET switch and a low-side MOSFET switch; and
driving at least one of the high-side MOSFET switch or the low-side MOSFET switch with a speed-up FET monolithically integrated with the high-side or low-side MOSFET switch; and
controlling one of the high-side or low-side MOSFET switches utilizing a signal transistor monolithically integrated with the high-side or low-side MOSFET switch having a source coupled to a gate of the high-side or low-side switch, a drain coupled to the speed-up FET and a gate coupled to an enable signal.

* * * * *